(12) United States Patent
Komatsu et al.

(10) Patent No.: US 6,921,499 B2
(45) Date of Patent: Jul. 26, 2005

(54) MASTER CARRIER FOR MAGNETIC TRANSFER

(75) Inventors: Kazunori Komatsu, Kanagawa (JP); Toshihiro Usa, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 301 days.

(21) Appl. No.: 10/192,849

(22) Filed: Jul. 11, 2002

(65) Prior Publication Data

US 2003/0026026 A1 Feb. 6, 2003

(30) Foreign Application Priority Data

Jul. 12, 2001 (JP) .......................................... 2001-212206

(51) Int. Cl.[7] .............................................. B29D 11/00
(52) U.S. Cl. ..................... 264/1.33; 264/1.36; 264/485; 425/810; 430/296; 430/320
(58) Field of Search ................................ 264/1.1, 1.33, 264/1.36, 2.5, 485; 360/16, 135; 430/296, 320; 425/810

(56) References Cited

U.S. PATENT DOCUMENTS 5,112,724 A    5/1992   Bradshaw 6,249,405 B1   6/2001   Hoshiya et al.

FOREIGN PATENT DOCUMENTS

| EP | 0 915 456 A1 | 5/1999 |
| WO | WO 00/65580 A1 | 11/2000 |

OTHER PUBLICATIONS

International Search Report.

*Primary Examiner*—Mathieu D. Vargot
(74) *Attorney, Agent, or Firm*—Sughrue Mion, PLLC

(57) ABSTRACT

To improve the quality of transfer signal by reducing loss of azimuth when the magnetic transfer is performed by bringing a master carrier and a slave medium into close contact with each other and applying transfer magnetic field thereto, even if the width of track is narrowed.

The master carrier 3 has a pattern which corresponds to a transfer information for high density recording and is formed of a soft magnetic layer 32 with a width W of track of 3 $\mu$m or less, wherein the pattern is written and formed by scanning with an electron beam EB of which a writing diameter d is smaller than the width W of track, on a same track over plural times. Writing is performed approximately to a rectangular shape, whereby the loss of azimuth can be reduced and the accuracy of transfer can be enhanced.

2 Claims, 2 Drawing Sheets

MASTER CARRIER FOR MAGNETIC TRANSFER

TECHNICAL FIELD

The present invention relates to a master carrier for bearing an information to be magnetically transferred to a slave medium.

BACKGROUND OF THE INVENTION

Magnetic transfer is to transfer and record a magnetic pattern which corresponds to an information (for example, a servo signal) carried on a master carrier, onto a slave medium by applying transfer magnetic field in a state that the master carrier carrying the transfer information by means of a fine unevenness pattern of magnetic substance and the slave medium having a magnetic recording part to be subject to magnetic transfer are brought into close contact with each other. For example, such a magnetic transfer method is disclosed in Japanese Unexamined Patent Publication Nos. sho 63-183623, hei 10-40544, hei 10-269566 and etc.

The master carrier used for magnetic transfer is formed by performing a treatment such as photofabrication, sputtering, and etching on a silicon substrate, glass substrate and the like thereby providing an unevenness pattern formed of magnetic substance.

In addition, it is considered to manufacture a master carrier for magnetic transfer by applying the lithography technique used in semiconductor field and the like or the stamper technique used in producing an optical disc stamper.

However, in order to enhance quality of transfer in the magnetic transfer as described in the above, it is required to form a master carrier with a transfer pattern out of a layer of magnetic substance with a good accuracy. In the master carrier, it has been found that the shape of prominence pattern is varied depending on a method of writing the pattern, thereby affecting on the characteristics of transfer.

For example, in a case of rotary type slave medium having disc shape, the unevenness pattern of transfer information corresponding to a servo signal is formed with a prominence pattern in a square or rectangular shape extended in the widthwise direction (radial direction) of track. It has been generally known that this pattern is formed by illuminating laser beam which has been modulated according to an information to be transferred, while rotating a disc coated with an EB resist.

However, if the width of track becomes narrowed to 0.3 $\mu$m or less to cope with the increase of recording density and the like, the writing diameter approaches to the limit of writing diameter for a laser beam and it is difficult to form a rectangular pattern because an end portion of prominence pattern is formed into a shape of circular arc. If the end portion of prominence pattern is formed into the shape of circular arc, the circular arc-shaped part causes loss of azimuth in the transfer magnetic field when the magnetic transfer is executed in a state that the master carrier and slave medium are brought into close contact with each other, whereby the magnetic pattern is incompletely formed on the slave medium and it becomes impossible to magnetically transfer and record a signal distinctly.

The present invention was conceived in consideration of the above problems in mind. The object of the present invention is to provide a master carrier for magnetic transfer adapted to enhance signal quality of transfer by reducing loss of azimuth at the time of magnetic transfer even when the width of track has been narrowed.

SUMMARY OF THE INVENTION

According to an aspect of the present invention, there is provided a master carrier for magnetic transfer having a pattern which corresponds to a transfer information for high density recording and is formed of a soft magnetic layer with a track width of 0.3 $\mu$m or less, wherein said pattern is written and formed by scanning with an electron beam of which a writing diameter is smaller than said width of track, on a same track over plural times.

Assuming that said width of track is W, the number of times for scanning one track is n, the writing diameter is d, and a coefficient indicating an overlapping degree of electron beam is k, they have a relationship of $W=[n-(n-1)k] \times d$, wherein said coefficient k is set to be not less than 0 and not more than 0.8, and preferably not less than 0.2 and not more than 0.8. And, the number of times of scanning n is 2 or more, wherein as the number of times of scanning n is increased and as the writing diameter d is decreased, the shape of pattern approaches to a rectangular shape but the time needed for writing becomes longer.

It is preferable to manufacture said master carrier for magnetic transfer by illuminating a disc coated with an EB resist, while rotating the disc and scanning with an electron beam which has been modulated in accordance with a transfer information and has a writing diameter smaller than the width of track, on a same track over plural times to perform writing, and producing a substrate provided with an unevenness pattern by mastering based on the writing, and then coating a layer of soft magnetic substance on said substrate.

According to the master carrier of the present invention as described in the above, because the pattern, which corresponds to a transfer information for high density recording and is formed of a layer of soft magnetic substance with a width of track of 0.3 $\mu$m or less, is written and formed by scanning electron beam having a writing diameter smaller than said width of track on the same track over plural times, the end portion of prominence pattern approaches to a rectangular shape rather than a circular arc shape and a fine unevenness pattern is manufactured with a good accuracy, whereby the loss of azimuth of transfer magnetic field can be reduced at the time of magnetic transfer and the quality of transfer signal can be enhanced by transferring and recording a distinct magnetic pattern.

BRIEF DESCRIPTION OF THE DRAWINGS

The embodiments of the present invention will be explained with reference to the accompanying drawings, in which.

DETAILED DESCRIPTION OF THE INVENTION

Figure 1:
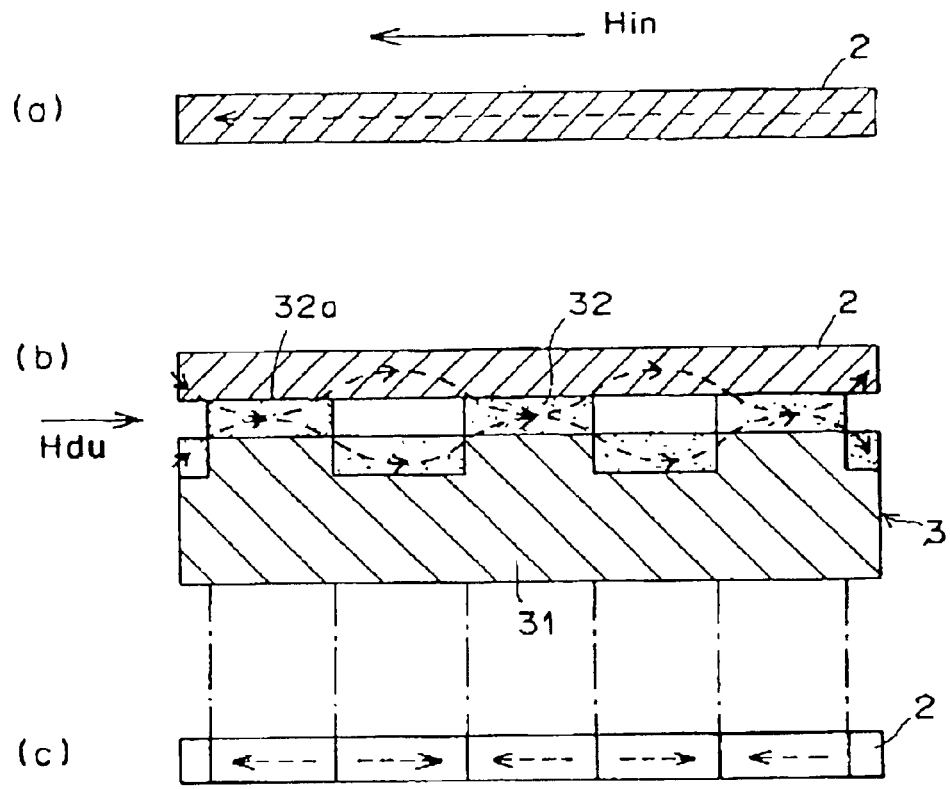
FIGS. 1(a), 1(b), and 1(c) illustrates steps of magnetic transfer method using a master carrier according to one embodiment of the present invention.
Figure 2:
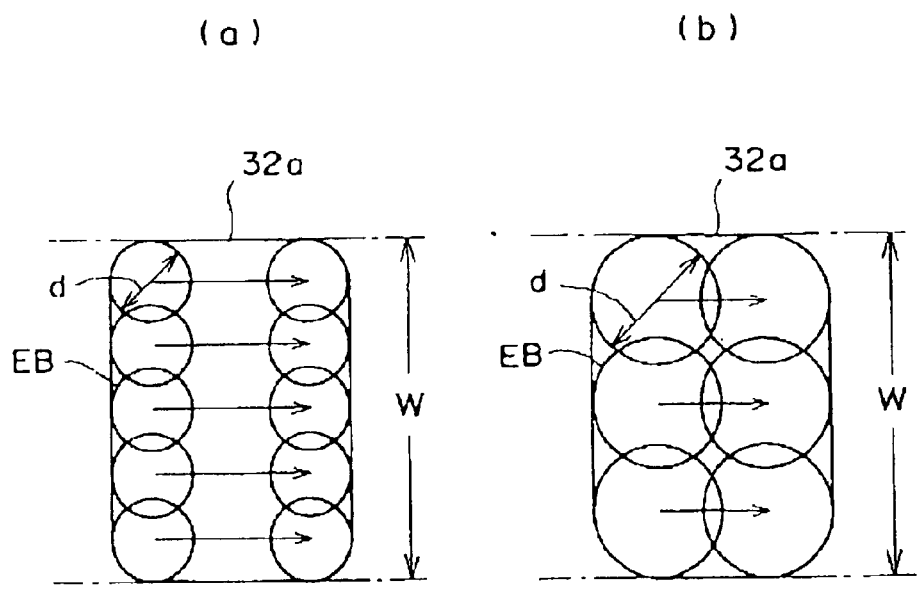
FIGS. 2(a) and 2(b) are schematic views showing the writing of prominence pattern of the master carrier.
Figure 3:
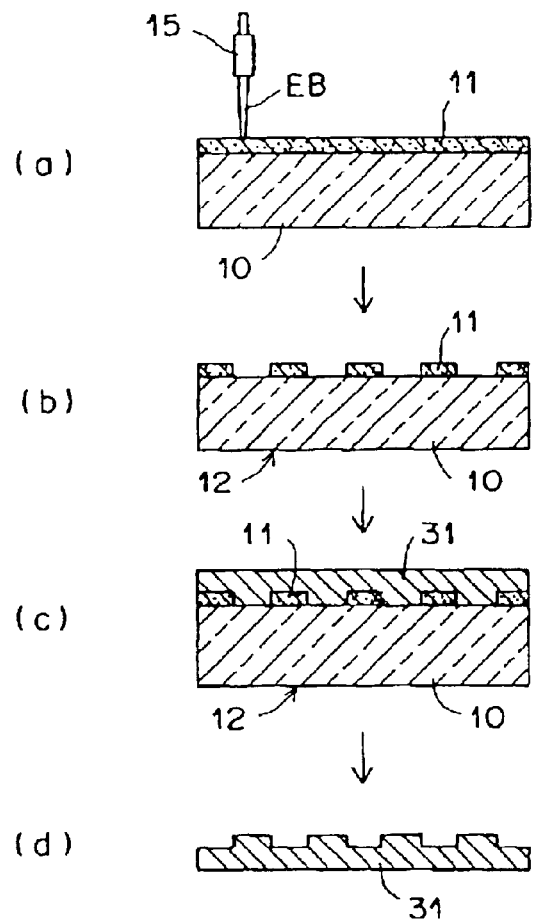
FIGS. 3(a), 3(b), 3(c) and 3(d) are cross sectional views showing an example of manufacturing process of the master carrier.

Herein below, embodiments of the present invention will be described in detail. FIG. 1 shows an example of magnetic transfer method using a master carrier according to one embodiment of the present invention. FIG. 2 is a schematic view showing the writing of prominence pattern of the master carrier and FIG. 3 is a cross sectional view showing an example of manufacturing process of the master carrier. The mode shown in FIG. 1 is an inplane recording method. Each of figures is a schematic view and the size of each part is depicted in a different scale.

The summary of magnetic transfer by means of the inplane recording method will be explained with reference to FIG. 1. Firstly, initial magnetization (direct current demagnetization) is performed in advance by applying an initial magnetostatic field Hin to a slave medium 2 in one direction in the track directions as shown in FIG. 1(a). Thereafter, as shown in FIG. 1(b), the slave surface (magnetic recording part) of the slave medium 2 and the prominence pattern 32a of information bearing surface, which is formed of a soft magnetic layer 32 (magnetic substance) coated on the fine unevenness pattern of substrate 31 of master carrier 3, are brought into close contact with each other, and then the magnetic transfer is executed by applying transfer magnetic field Hdu in the track direction of slave medium 2 but opposite to that of said initial magnetic field Hin. The transfer magnetic field Hdu absorbed into the soft magnetic layer 32 of prominence pattern 32a, whereby the magnetization is not reversed in that portion and reversed in the other portion. As a result, a magnetic pattern is transferred and recorded on a slave surface (track) of the slave medium 2 in accordance with the closely contacted prominence pattern 32a and depression space forming pattern of the soft magnetic layer 32 in the information bearing surface of the master carrier 3, as shown in FIG. 1(c).

The master carrier 3 is formed in a disc shape, one side of which has a transfer information bearing surface provided with a fine unevenness pattern formed of the soft magnetic layer 32 to correspond to a servo signal and the other side of which is maintained in a holder which is not shown and is brought into close contact with the slave medium 2. As shown in the figure, there are two cases: a case where the master carrier 3 is brought into close contact with one side of the slave medium 2 and one side-sequential transfer is executed and a case where master carriers 3 are brought into close contact with both sides of slave medium 2 and both side-simultaneous transfer is executed.

The prominence pattern 32a in the master carrier 3 for magnetic transfer is formed on the basis of writing of electron beam EB, as shown in FIG. 2. The width W of track is 0.3 μm or less and the pattern is written and formed by scanning with an electron beam, which has a writing diameter smaller than the width W of track on a same track over plural times. In the case of FIG. 2(a), the writing is performed by scanning five times with a small writing diameter d, while in the case of FIG. 2(b), the writing is performed by scanning three times with a writing diameter d which is larger than that of FIG. 2a.

In the writing performed with an electron beam EB, the width of track W, the number of times for scanning of one track n and the writing diameter of electron beam d have a relationship of W=[n−(n−1)k]×d, when the coefficient is defined as k. The coefficient k indicates the overlapping degree of writing of electron beam and is set to be not less than 0 and not more than 0.8, and preferably not less than 0.2 and not more than 0.8. The greater the value of coefficient k is, the greater the overlapping of writing of electron beam EB is. The number of times of scanning is 2 or more, wherein as the number of times of scanning n is increased, as the writing diameter d is decreased, and as the coefficient k is increased, the shape of pattern approaches to a rectangular shape but the time needed for writing becomes longer.

Rounding the corners of the prominence pattern 32a is determined by the writing diameter d, and the leading end area and trailing end area of the prominence pattern 32a in the track direction are determined by writing diameter d, the number of times of scanning n and the coefficient k, wherein in order to reduce the loss of azimuth, it is effective to reduce the writing diameter d, to increase the number of times of scanning n, and to increase the coefficient k. Considering this point, it is preferable to establish the number of times of scanning n as a small value in view of improving the transfer efficiency.

Although not shown in the figures, an actual servo signal also has a prominence pattern which is offset by a half pitch from the track pitch, and the writing of this prominence pattern is executed identically to the above.

In addition, even if the unevenness pattern of substrate 31 of said master carrier 3 is a negative pattern of unevenness shape which is opposite to a positive pattern shown in FIG. 1, it is possible to record an identical magnetic pattern by reversing the directions of initial magnetic field Hin and transfer magnetic field Hdu to be opposite to those of the above. Also, it is preferable to form a protective film such as diamond like carbon (DLC) on the soft magnetic layer 32, and a lubricant layer may be formed thereon. And, it is more preferable that a DLC film of 5~30 nm thick as a protective film and a lubricant layer are present. Also, an adherence-enhancing layer such as Si may be formed between the soft magnetic layer 32 and the protective layer. The lubricant may prevent deterioration of endurance such as occurrence of damage caused by friction when correcting deviation which is generated in the course of contact with the slave medium 2.

For the substrate 31 of the master carrier 3, nickel silicon, quartz plate, glass, aluminum, alloy, ceramics, synthetic resin and the like are used. Formation of unevenness pattern is executed by stamper method or the like.

The steps of manufacturing the substrate 31 of the master carrier 3 for magnetic transfer according to an embodiment will be explained with reference to FIGS. 3(a) to (d). At first, as shown in FIG. 3(a), an EB resist solution is coated on a disc 10 (glass or quartz) having a smooth surface by spin-coating or the like to form an EB resist 11, an electron beam EB which has been modulated corresponding to an transfer information such as servo signal, is scanned on the disc 10 while rotating the disc 10 having the EB resist 11, and the EB resist 11 of each track is exposed to a predetermined pattern. Said electron beam is converged and scanned on a predetermined writing diameter d which is smaller than the width W of track by a conventional electron gun 15. When the number of times of scanning is five (5), the writing of pattern for one track is performed with five revolutions by allowing the exposure position to be radially deviated per each revolution. Thereafter, as shown in FIG. 3(b), the EB resist 11 is subject to a development treatment and the exposed portions are removed, whereby a master disc 12 having an unevenness pattern formed of the EB resist 11 is obtained.

Next, on the basis of unevenness pattern of surface of said master disc 12, a thin conductive layer is deposited on the surface, and then a substrate 31 formed of a metal disc having a positive unevenness pattern is manufactured by mastering that performs electroforming, as shown in FIG. 3(c), in which the unevenness pattern assumes a metallic mold. The substrate 31 formed to a predetermined thickness is removed from the master disc 12 as shown in FIG. 3(d).

The unevenness pattern on the surface of said substrate 31 has a shape inverted from the unevenness pattern of said master disc 12. The rear surface of substrate 31 is polished and then a magnetic layer is coated on the unevenness pattern, whereby a-master carrier 3 for magnetic transfer is obtained.

It is possible to manufacture a substrate having a negative pattern by performing plating treatment on said master carrier to manufacture a second master disc and then performing plating treatment using the second master disc. It is also possible to manufacture a substrate having a positive pattern by performing plating treatment or adhering and curing a resin solution on the second master disc to manufacture a third master disc and then performing plating on the third master disc.

For metallic material for the substrate 31, Ni or Ni alloy may be used, and various metal deposition method such as non-electrolysis plating, electroforming, sputtering, ion plating can be applied for said plating to manufacture the substrate. The depth (prominence height) of unevenness pattern of the substrate 31 is preferably in a range of 80 nm~800 nm, and more preferably in a range of 100 nm~600 nm.

Said soft magnetic layer 32 is formed by depositing a magnetic material with thin film deposition means such as vacuum deposition method, sputtering method, ion plating method, or plating method and the like.

For the magnetic material, it is possible to use Co, Co alloy (CoNi, CoNiZr, CoNbTaZr and the like), Fe, Fe alloy (FeCo, FeCoNi, FeNiMo, FeAlSi, FeAl, FeTaN), Ni, and Ni alloy (NiFe). Most preferred materials are FeCo and FeCoNi. The thickness of magnetic layer is preferably in a range of 50 nm~500 nm, and more preferably in a range of 100 nm~400 nm.

It is possible to manufacture a resin substrate using said master disc, and then to form a magnetic layer on its surface, thereby using it as a master carrier. For the resin material of resin substrate, it is possible to use acryl resin such as polycarbonate, polymethylmethacrylate; chloride vinyl resin such as poly chloride vinyl, chloride vinyl copolymer; amorphous polyolefin; polyester and the like. In view of moisture resistance, dimensional stability, price and the like, polycarbonate is preferred. If burr is present in a formed article, it may be removed by burnishing or polishing. In addition, UV-curing resin, electron beam curing resin and the like may be applied on the master disc by bar-coating or spin-coating. The height of prominence of pattern in the resin substrate is preferably in a range of 50~1000 nm, and more preferably in a range of 100~500 nm. A master carrier is obtained by coating a layer of soft magnetic substance on the fine pattern in the surface of said resin substrate. The soft magnetic layer is formed by depositing a magnetic material with thin film deposition means such as vacuum deposition method, sputtering method, ion plating method, or plating method and the like.

The master carrier 3 which is substantially identical to that used in the inplane recording mode may be also used in the perpendicular recording method. In the case of perpendicular recording, the magnetic transfer is executed in such a manner that the slave medium 2 is previously magnetized by initial direct current magnetization in one normal direction, and then the slave medium is brought into close contact with the master carrier 3 and transfer magnetic field is applied in the normal direction substantially opposite to the initial direct current magnetization, wherein the transfer magnetic field is absorbed into the soft magnetic layer 32 on the prominence pattern 32a of the master carrier 3 and the perpendicular magnetization is reversed in the portion corresponding to the prominence pattern 32a, whereby the magnetic pattern which corresponds to the unevenness pattern of the master carrier can be recorded on the slave medium 2.

As the slave medium 2, a disc shaped medium formed with magnetic recording part (magnetic layer) on one surface or both surfaces thereof such as high-recording density flexible disc, hard disc and the like are used, wherein the magnetic recording part is formed as a coated type magnetic recording layer or metallic thin film type magnetic recording layer. For the magnetic material of metallic thin film type magnetic recording layer, it is possible to use Co, Co alloy (CoPtCr, CoCr, CoPtCrTa, CoPtCrNbTa, CoCrB, CoNi and the like), Fe, Fe alloy (FeCo, FePt, FeCoNi) can be used. It is preferable that the magnetic material has a higher magnetic flux density and a magnetic anisotropy in the direction same with the magnetic field applying direction (inplane direction in case of inplane recording and normal direction in case of perpendicular recording), because more distinct transfer can be executed. In order to provide a required magnetic anisotropy to the underside (support side) of magnetic material, it is preferable to form a non-magnetic base layer. It is required to conform the crystal structure and lattice constant to the magnetic layer. For this purpose, Cr, CrTi, CoCr, CrTa, CrMo, NiAl, Ru and the like are used.

In case of inplane recording, the magnetic field applying means for applying transfer magnetic field and initial magnetic field comprises ring-shaped electromagnets located in the upper and lower sides of the holder and applies transfer magnetic field generated parallel to the track direction in the same direction from the upper and lower sides, wherein the electromagnets include coils wound around cores each having a gap extended, for example, in the radial direction of the slave medium 2. The transfer magnetic field is applied to the closely contacted slave medium 2 and master carrier 3 by the magnetic field applying means while they are being rotated. It is also possible to form the magnetic field applying means to be rotatable. In addition, it is possible to install the magnetic field applying means on the one side only, and it is also possible to install a permanent magnetic device on one side or both sides.

In case of perpendicular recording, the magnetic field applying means comprises electromagnets or permanent magnets of different polarities, which are located in the upper and lower sides of the closely contacted slave medium 2 and master carrier 3, and generates and applies magnetic field in the normal direction. If the magnetic field is partially applied, the magnetic transfer over the entire surface is performed by moving the closely contacted slave medium 2 and master carrier 3 or the magnetic field.

According to the master carrier 3 of the embodiments explained in the above, since the width W of track is formed by divisionally performing transfer over plural times using an electron beam having a predetermined writing diameter d, the prominence pattern 32a can be formed on the basis of writing approximate to a rectangular shape and it is possible to execute magnetic transfer with a good transfer quality due to the reduced loss of azimuth and pattern of high accuracy, even if the width W of track is narrowed to 3 $\mu$m or less.

Figure 4:
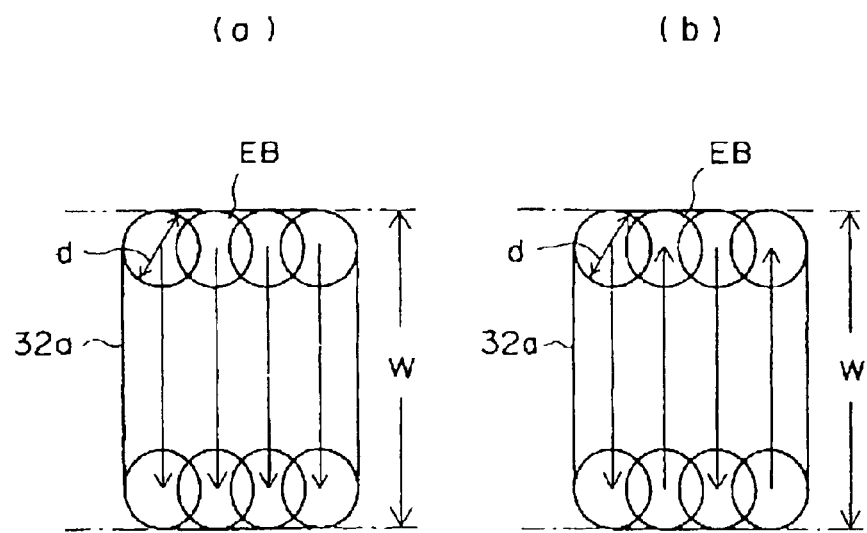
FIGS. 4(a) and 4(b) are schematic views showing the writing of prominence pattern of master carrier according to another embodiment of the present invention.

FIG. 4 shows the writing of prominence pattern 32a according to another embodiment. In this embodiment, the writing is performed in the widthwise direction of track (radial direction), while FIG. 2 shows the case where the writing direction is in the track direction.

In FIG. 4(a), the writing is performed by scanning with an electron beam EB of which a writing diameter d is smaller than the width W of track, in the widthwise direction of track over plural times, wherein the scanning direction is same every time. In addition, in FIG. 4(b), the writing is performed with the scanning directions being alternately reversed each time of scanning.

What is claimed is:

1. A method of manufacturing a master carrier for magnetic transfer comprising a substrate having an unevenness pattern which corresponds to a transfer information for high density recording, and which master carrier comprises a soft magnetic layer with a track width of 0.3 $\mu$m or less, said method comprising:

writing said master carrier for magnetic transfer by illuminating a disc coated with an electron beam resist while rotating the disc and scanning at least twice with an electron beam which has been modulated in accordance with a transfer information and has a writing diameter smaller than the width of a track on a same track over plural times, whereby said electron beam scans partially overlap within a given track to write and form a pattern;

producing said substrate having an unevenness pattern by mastering based on the writing; and coating a layer of soft magnetic substance on said substrate, wherein a coefficient k, which satisfies a formula of W=[n−(n−1)k]×d is set to be not less than 0 and not more than 0.8, provided that k is a degree of overlap of the electron beam in writing a given track, W is the width of a given track in $\mu$m, n is the number of times that a given track is scanned by the electron beam, and d is the diameter of the electron beam in $\mu$m.

2. The method as claimed in claim 1, wherein the unevenness pattern of the master carrier is the same as or opposite the pattern written by the scanning electron beam.

* * * * *